(12) United States Patent
Somenath et al.

(10) Patent No.: US 8,963,118 B2
(45) Date of Patent: Feb. 24, 2015

(54) TRANSISTOR ARRANGEMENT AND A METHOD OF FORMING A TRANSISTOR ARRANGEMENT

(75) Inventors: Roy Somenath, Singapore (SG); Zhiqiang Gao, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 475 days.

(21) Appl. No.: 13/388,294

(22) PCT Filed: Jul. 30, 2010

(86) PCT No.: PCT/SG2010/000287
§ 371 (c)(1),
(2), (4) Date: Apr. 16, 2012

(87) PCT Pub. No.: WO2011/014129
PCT Pub. Date: Feb. 3, 2011

(65) Prior Publication Data
US 2013/0200332 A1     Aug. 8, 2013

(30) Foreign Application Priority Data
Jul. 31, 2009    (SG) .............................. 200905151-7

(51) Int. Cl.
*H01L 29/22*         (2006.01)
*H01L 29/66*         (2006.01)
(Continued)

(52) U.S. Cl.
CPC ........... *H01L 29/66439* (2013.01); *B82Y 10/00* (2013.01); *H01L 29/0665* (2013.01);
(Continued)

(58) Field of Classification Search
CPC .............................. H01L 29/775; H01L 29/22
USPC ........................................................ 257/9–10
See application file for complete search history.

(56) References Cited

U.S. PATENT DOCUMENTS 7,382,162 B2 * 6/2008 Chiang et al. ................. 326/121
8,030,971 B2 * 10/2011 Chiang et al. ................. 326/121
(Continued)

FOREIGN PATENT DOCUMENTS

CN        101431328 A      5/2009
JP      2006-245127 A      9/2006
(Continued)

OTHER PUBLICATIONS

Somenath Roy. et al., "Direct-write fabrication of a nanoscale digital logic element on a single nanowire," Nanotechnology, 2010, vol. 21, Article 245306, 5 pgs.. (May 25, 2010).
(Continued)

*Primary Examiner* — Nathan Ha
(74) *Attorney, Agent, or Firm* — Blakely, Sokoloff, Taylor & Zafman LLP (57) ABSTRACT

In an embodiment, a transistor arrangement is provided. The transistor arrangement comprises a nanowire including a first nanowire region and a second nanowire region; a first gate contact disposed over the first nanowire region; an insulating region disposed over the second nanowire region; a second gate contact disposed over the insulating region; wherein the first nanowire region and the first gate contact forms a part of an enhancement mode transistor and the second nanowire region, the insulating region and the second gate contact forms a part of a depletion mode transistor. A method of forming a transistor arrangement may also be provided. Also contemplated is a transistor and a method for forming said transistor, where the transistor comprises a nanowire and a gate contact, where the gate contact is formed by directly writing the gate contact onto a region of the nanowire.

14 Claims, 5 Drawing Sheets

(51) Int. Cl.
*B82Y 10/00* (2011.01)
*H01L 29/06* (2006.01)
*H01L 29/775* (2006.01)
*H01L 29/786* (2006.01)

(52) U.S. Cl.
CPC .......... *H01L29/0673* (2013.01); *H01L 29/775* (2013.01); *H01L 29/22* (2013.01); *H01L 29/78696* (2013.01)
USPC .......................................................... 257/9

(56) References Cited

U.S. PATENT DOCUMENTS

| | | | |
|---|---|---|---|
| 8,344,361 B2* | 1/2013 | Wernersson et al. | 257/40 |
| 8,368,052 B2* | 2/2013 | Pillarisetty et al. | 257/24 |
| 8,368,125 B2* | 2/2013 | Chidambarrao et al. | 257/255 |
| 2009/0072223 A1 | 3/2009 | Awano | |
| 2009/0302394 A1* | 12/2009 | Fujita | 257/369 |

FOREIGN PATENT DOCUMENTS

| | | |
|---|---|---|
| JP | 2008-258558 A | 10/2008 |
| WO | WO 2008/109204 A2 | 9/2008 |

OTHER PUBLICATIONS

J. Orloff. et al., "High Resolution Focused Ion Beams: FIB and Its Applications," Springer Press, pp. 224 to 225 (2003).

S. J. Randolph, et al., "Focused, Nanoscale Electron-Beam-Induced Deposition and Etching," Critical Reviews in Solid State and Materials Sciences, vol. 31, Issue 3, pp. 55-89 (2006).

T. Hanrath and B. A. Korgel, "Germanium nanowire transistors: a comparison of electrical contacts patterned by electron beam lithography and beam-assisted chemical vapour Deposition," Proceedings of the institution of Mechanical Engineers, Part N: Journal of Nanoengineering and Nonosystems, vol. 218 No. 1, pp. 25-34 (Jun. 1, 2004).

Gunho Jo, et al., "Logic inverters composed of controlled depletion-mode and enhancement-mode ZnO nanowire transistors," Applied Physics Letters, vol. 94, pp. 173118-1 to 173118-3 (2009).

PCT International Application No. PCT/SG2010/000287, Written Opinion of the International Preliminary Examining Authority, Mailed Jun. 30, 2011, 12 pages.

PCT International Application No. PCT/SG2010/000287, Written Opinion of the International Preliminary Examining Authority (PCT Rule 66), Mailed Sep. 20, 2011, 11pages.

PCT International Search Report for PCT Counterpart Application No. PCT/SG2010/000287 containing Communication relating to the Results of the International Search Report, 7 pgs., (Oct. 27, 2010).

PCT Written Opinion of the International Searching Authority for PCT Counterpart Application No. PCT/SG2010/000287, 11 pgs., (Oct. 27, 2010).

PCT International Preliminary Report on Patentability (Chapter II of the Patent Cooperation Treaty) for PCT Counterpart Application No. PCT/SG2010/000287, 24 pgs., (Nov. 21, 2011).

Somenath Roy, et al., "Direct-Write Fabrication of a Nanoscale Digital Logic Element on a Single Nanowire", Nanotechnology, vol. 21, Article 245306, 5 pgs., (2010).

Jon Orloff, et al., "High Resolution Focused Ion Beams: FIB and its Applications", Springer Press, ISBN 0-306-47350-X, 7 pgs., (2003).

S. J. Randolph, et al., "Focused, Nanoscale Electron-Beam-Induced Deposition and Etching", Critical Reviews in Solid State and Materials Sciences, vol. 31, Issue 3, pp. 55-89. (2006).

T. Hanrath, et al., "Germanium Nanowire Transistors: A Comparison of Electrical Contacts Patterned by Electron Beam Lithography and Beam-Assisted Chemical Vapour Deposition", Proceedings of the Institution of Mechanical Engineers, Part N: Journal of Nanoengineering and Nanosystems, vol. 218, pp. 25-34, (2005).

Gunho Jo, et al., "Logic Inverters Composed of Controlled Depletion-Mode and Enhancement-Mode ZnO Nanowire Transistors", Applied Physics Letters, vol. 94, pp. 173118-1-173118-3, (2009).

* cited by examiner

TRANSISTOR ARRANGEMENT AND A METHOD OF FORMING A TRANSISTOR ARRANGEMENT

CROSS-REFERENCE TO RELATED APPLICATION

This patent application is a U.S. National Phase application under 35 U.S.C. §371 of International Application No. PCT/SG2010/000287, filed on 30 Jul. 2010, entitled A TRANSISTOR ARRANGEMENT AND A METHOD OF FORMING A TRANSISTOR ARRANGEMENT, which claims the benefit of priority of Singapore patent application number 200905151-7 filed on 31 Jul. 2009, the contents of which is hereby incorporated by reference in its entirety for all purposes.

TECHNICAL FIELD

Embodiments relate to a transistor arrangement and a method of forming a transistor arrangement. Further embodiments relate to a transistor and a method of forming a transistor.

BACKGROUND

As complementary metal-oxide-semiconductor (CMOS) scaling may be reaching its theoretical limit, apparently evading the historical Moore's law, it may necessitate a strategic shift from pure down-scaling to a hunt for new functional materials and hybrid technology platforms. On the verge of 'beyond silicon' era, much attention may be focused on the alternative materials, inclusive of carbon nanotubes and semiconducting nanowires. Because of the unique electronic band structures and reduced carrier scattering in quasi-1D materials like nanotubes and nanowires, novel device functionalities in scalable circuit architectures may be realized. Nevertheless, lack of controlled assembly, fabrication intricacy and low throughput may be posing persistent challenges to advance from a single device level to a functional circuit level. Thus, it may be imperative to develop rational strategies for the assembly of building blocks into increasingly complex structures.

Conventionally, electron-beam (e-beam) lithography technique may have been employed in fabricating logic devices and integrated circuits based on nanotubes and nanowires. Though a certain level of design complexities and low-scale integration may be achieved, the e-beam lithography approach involving multiple process steps may yet to carve a niche as long as the throughput may be concerned. Further, the need to register individual nanowire (nanotube)-electrode interconnects may prevent e-beam lithography to realize its full potential.

Therefore, there is a need to provide an alternative method to fabricate nano-scale digital logic elements which may overcome or at least alleviate some of the above-mentioned problems.

SUMMARY

Various embodiments provide a method of using focused electron beam (FEB) or focused ion beam (FIB) to fabricate a top-gated transistor which may exhibit either enhancement mode (E-mode) or depletion mode (D-mode) characteristics. Further, various embodiments may provide a method of integrating an E-mode driver with a D-mode load to construct an inverter.

In various embodiments, a transistor arrangement may be provided. The transistor arrangement may include a nanowire including a first nanowire region and a second nanowire region; a first gate contact disposed over the first nanowire region; an insulating region disposed over the second nanowire region; a second gate contact disposed over the insulating region; wherein the first nanowire region and the first gate contact may form a part of an enhancement mode transistor and the second nanowire region, the insulating region and the second gate contact may form a part of a depletion mode transistor.

In various embodiments, a method of forming a transistor arrangement may be provided. The method may include forming a nanowire including a first nanowire region and a second nanowire region over a support substrate; forming a first gate contact over the first nanowire region; forming an insulating region over the second nanowire region; forming a second gate contact over the insulating region; wherein forming the first nanowire region and the first gate contact may form a part of forming an enhancement mode transistor and forming the second nanowire region, the insulating region and the second gate contact may form a part of forming a depletion mode transistor.

In various embodiments, a method of forming a transistor may be provided. The method may include forming a nanowire over a support substrate; and forming a gate contact directly onto a region of the nanowire; wherein the gate contact may be formed by directly writing a metal electrode onto the region of the nanowire.

In various embodiments, a transistor may be provided. The transistor may include a nanowire and a gate contact directly written onto a region of the nanowire.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments of the invention are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

An embodiment may provide for a transistor arrangement. The transistor arrangement may include a nanowire including a first nanowire region and a second nanowire region; a first gate contact disposed over the first nanowire region; an insulating region disposed over the second nanowire region; a second gate contact disposed over the insulating region; wherein the first nanowire region and the first gate contact may form a part of an enhancement mode transistor and the second nanowire region, the insulating region and the second gate contact may form a part of a depletion mode transistor.

In an embodiment, the enhancement mode transistor may be termed as "normally off" transistor because this type of transistor may operate by having a channel enhanced in the semiconductor material where no channel was constructed. The enhancement mode transistor may include a p-channel or an n-channel. Correspondingly, the depletion mode transistor may be termed as "normally on" transistor because this type of transistor may operate by creating a depletion region within an existing channel. Similarly, the depletion mode transistor may include may include a p-channel or an n-channel.

In an embodiment, the nanowire may be a zinc oxide (ZnO) nanowire. For example, the ZnO nanowire may be synthesized by a simple one-step template-free procedure in an aqueous solution. In a typical experiment, about 0.10 g of zinc acetate may be dissolved into about 3.0 mL of water. The solution may be stirred with a magnetic stir bar. About 7.0 ml of 2-(2-Aminoethoxy)ethanol (AOE) may be added dropwise. The clear mixture may turn cloudy with the addition of AOE and then become clear again at the end of the addition. The mixture may be incubated at about 70° C. in a water bath overnight. The product may be collected and washed with ethanol by centrifugation-redispersion cycles with alcohol. The pellet of purified ZnO nanowires may be dried overnight at room temperature in vacuum and then calcinated at about 100° C. for about 5 h to obtain crystalline ZnO nanowires.

In an embodiment, the transistor arrangement may further include a first source contact and a first drain contact respectively disposed in connection with or over the first nanowire region such that the first gate contact may be positioned between the first source contact and the first drain contact. The first gate contact may be positioned at any suitable distance away from the respective first source contact and the first drain contact. The first gate contact may also be configured and arranged such that the first gate contact may be arranged substantially parallel to each of the respective first source contact and the first drain contact. Each of the respective first gate contact, the first source contact and first drain contact may be substantially rectangle and elongated. However, the shape and dimensions of the respective first gate contact, the first source contact and first drain contact may vary depending on user and design requirements.

In an embodiment, the transistor arrangement may further include a second source contact and a second drain contact respectively disposed in connection with or over the second nanowire region such that the second gate contact may be positioned between the second source contact and the second drain contact. The second gate contact may be positioned at any suitable distance away from the respective second source contact and the second drain contact. The second gate contact may also be arranged such that the second gate contact may be arranged substantially parallel to each of the respective second source contact and the second drain contact. Each of the respective second gate contact, the second source contact and second drain contact may be substantially rectangle and elongated. However, the shape and dimensions of the respective second gate contact, the second source contact and second drain contact may vary depending on user and design requirements.

In an embodiment, the first gate contact and the first nanowire region may form a schottky contact or schottky barrier. The schottky barrier refers to a metal-semiconductor contact having a large barrier height (i.e. $\Phi_B > kT$) and relatively low doping concentration that may be less than the density of states in the conduction band or valence band. The potential barrier between the metal and the semiconductor may be identified on an energy band diagram. In this regard, the metal may be the first gate contact and the semiconductor may be the first nanowire region.

In an embodiment, the first source contact and the first nanowire region may form an ohmic contact and the first drain contact and the first nanowire region may form a further ohmic contact. The respective ohmic contact and further ohmic contact may be respective regions on a semiconductor material that may have been prepared so that the current-voltage (I-V) curve of the device may be linear and symmetric.

In an embodiment, the insulating region may be configured to substantially surround the second nanowire region. The insulating region may include a thickness in a range of about 1 nm to about 100 nm, for example about 25 nm.

In an embodiment, the second nanowire region may be positioned adjacent to the first nanowire region. The second nanowire region may be positioned directly adjacent to the first nanowire region or may be positioned at a distance away from the first nanowire region. In this regard, the first nanowire region and the second nanowire region may be positioned at any suitable positions along the nanowire. There may also be further nanowire regions on the same nanowire depending on user and design requirements.

In an embodiment, the transistor arrangement may further include a support substrate, wherein the nanowire may be positioned above and/or spaced at a distance away from the support substrate. The support substrate may include a semiconductor material or a material selected from a group of materials consisting of silicon (Si), glass, quartz, alumina, for example. If the support substrate may include an insulating material, the nanowire may also be positioned directly in contact with the support substrate.

In an embodiment, the nanowire may include a material selected from a group consisting of ZnO, $SnO_2$, TiO2, GaN, InO, other semiconducting nanowires or nanotubes for example.

In an embodiment, each of the first source contact, the first gate contact, the first drain contact, the second source contact, the second gate contact, the second drain contact may include a metal or conductive material selected from a group consisting of Pt, Au, Pd, Ir, Ni, other high work-function metals for example. The respective first source contact, the first gate contact, the first drain contact, the second source contact, the second gate contact, the second drain contact may be of the same or different metal or conductive material.

In an embodiment, the insulating region may include a material selected from a group consisting of $SiO_2$, $Al_2O_3$, $TiO_2$, $HfO_2$, other high-k dielectric materials for example.

In an embodiment, the first source contact may be coupled to a ground potential.

In an embodiment, the first gate contact may be coupled to a voltage input of the transistor arrangement.

In an embodiment, the first drain contact may be coupled to the second source contact.

In an embodiment, the second gate contact may be coupled to a voltage output of the transistor arrangement.

In an embodiment, the second drain contact may be coupled to a supply voltage. The supply voltage may range between about 0.1 V to about 100 V, for example about 5V to 10 V.

In an embodiment, the second gate contact may be further coupled or connected to the first drain contact and the second source contact.

In an embodiment, the enhancement mode transistor may form a driver of the transistor arrangement.

In an embodiment, the depletion mode transistor may form a load of the transistor arrangement.

In an embodiment, the transistor arrangement may be configured as a direct-coupled field-effect transistor logic (DCFL) inverter or a Saturated Buffer FET Logic (SBFL) inverter.

An embodiment may provide for a method of forming a transistor arrangement. The method may include forming a nanowire comprising a first nanowire region and a second nanowire region over a support substrate; forming a first gate contact over the first nanowire region; forming an insulating region over the second nanowire region; forming a second gate contact over the insulating region; wherein forming the first nanowire region and the first gate contact may form a part of forming an enhancement mode transistor and forming the second nanowire region, the insulating region and the second gate contact may form a part of forming a depletion mode transistor.

In an embodiment, the method may further include forming a first source contact and a first drain contact respectively in connection with or over the first nanowire region such that the first gate contact may be formed between the first source contact and the first drain contact.

In an embodiment, the method may further include forming a second source contact and a second drain contact respectively in connection with or over the second nanowire region such that the second gate contact may be formed between the second source contact and the second drain contact.

In an embodiment, forming the first gate contact over the first nanowire region may include forming a schottky contact between the first gate contact and the first nanowire region.

In an embodiment, forming the first source contact in connection with or over the first nanowire region may include forming an ohmic contact between the first source contact and the first nanowire region and wherein forming the first drain contact in connection with or over the first nanowire region may include forming a further ohmic contact between the first drain contact and the first nanowire region.

In an embodiment, forming the insulating region over the second nanowire region may include forming the insulating region such that the insulating region may be configured to substantially surround the second nanowire region.

In an embodiment, forming the nanowire may include forming the second nanowire region adjacent to the first nanowire region.

In an embodiment, forming the nanowire over the support substrate may include forming the nanowire above and at a distance away from the support substrate.

In an embodiment, forming the first gate contact over the first nanowire region may include direct writing of a metal electrode onto the first nanowire region.

In an embodiment, direct writing of the metal electrode onto the first nanowire region may include writing using a focused electron beam or a focused ion beam.

In an embodiment, forming the insulating region over the second nanowire region may include direct writing of a dielectric layer onto the second nanowire region.

In an embodiment, direct writing of the dielectric layer onto the second nanowire region may include writing using a focused electron beam or a focused ion beam.

In an embodiment, forming the second gate contact over the insulating region may include direct writing of a metal electrode onto the insulating region.

In an embodiment, direct writing of the metal electrode onto the insulating region may include writing using a focused electron beam or a focused ion beam.

In an embodiment, the metal electrode may include a material selected from a group of materials consisting of Pt, Au, Pd, Ir, Ni, other high work-function metals for example.

In an embodiment, the dielectric layer may include a material selected from a group of materials consisting of $Al_2O_3$, $TiO_2$, $HfO_2$ other high-k dielectric materials for example.

In an embodiment, forming the first source contact and the first drain contact respectively in connection with or over the first nanowire region may include direct writing of respective metal electrodes onto the first nanowire region.

In an embodiment, forming the second source contact and the second drain contact respectively in connection with or over the second nanowire region may include direct writing of respective metal electrodes onto the second nanowire region.

An embodiment may provide for a method of forming a transistor. The method may include forming a nanowire over a support substrate; and forming a gate contact directly onto a region of the nanowire; wherein the gate contact may be formed by directly writing a metal electrode onto the region of the nanowire. The direct writing of the metal electrode onto the region of the nanowire may be performed by FEB or FIB.

In an embodiment, forming the first gate contact directly onto the region of the nanowire may include forming a schottky contact between the gate contact and the region of the nanowire.

In an embodiment, the method may further include forming an insulating region between the region of the nanowire and the gate contact.

In an embodiment, forming the insulating region between the region of the nanowire and the gate contact may include direct writing of a dielectric layer onto the region of the nanowire. The direct writing of the dielectric layer onto the region of the nanowire may be performed by FEB or FIB.

An embodiment may provide for a transistor. The transistor may include a nanowire; and a gate contact directly written onto a region of the nanowire.

In an embodiment, the transistor may be configured as an enhancement mode transistor.

In an embodiment, the transistor may further include an insulating region positioned between the region of the nanowire and the gate contact.

In an embodiment, the transistor may be configured as a depletion mode transistor.

In an embodiment, a method for lithography-free, "direct-write" fabrication of nano-scale digital logic elements on a single nanowire may be provided.

In an embodiment, lithography-free fabrication and electrical characteristics of a nanoscale logic inverter, integrating enhancement-mode (E-mode) and depletion-mode (D-mode) field-effect transistors (FETs) on a single ZnO nanowire may be provided. 'Direct-writing' of platinum metal electrodes and dielectric layer may be executed on individual single-crystalline ZnO nanowires using either focused electron beam (FEB) or focused ion beam (FIB). A top-gate FET structure may be fabricated, in which the gate electrode may be wrapped around the ZnO nanowire, resulting in a more efficient gate response than the conventional back-gate nanowire transistors. For E-mode device operation, the gate electrode (e.g. Pt) may be deposited directly onto the ZnO nanowire by FEB, which may create a schottky barrier and in turn a fully depleted channel. Conversely, sandwiching an insulating layer between the FIB-deposited gate electrode and the nanowire channel may make D-mode operation possible. Integrated E- and D-mode FETs on a single nanowire may exhibit the characteristics of a direct-coupled FET logic (DCFL) inverter with high gain and noise margin.

In an embodiment, regarding the exploitation of FEB or FIB technique for fabrication, only FEB-assisted direct deposition of Pt gate electrode on the nanowire may be shown to produce E-mode FET, primarily because of the formation of Schottky contacts. For the D-mode FET, FIB-assisted gate electrode may be deposited on the 25 nm thick insulating layer or region, sandwiched between the nanowire and the Pt gate. For source and drain contacts, only FIB-assisted Pt contacts may be used, since the formation of ohmic contacts may be a prerequisite.

Figure 1A:
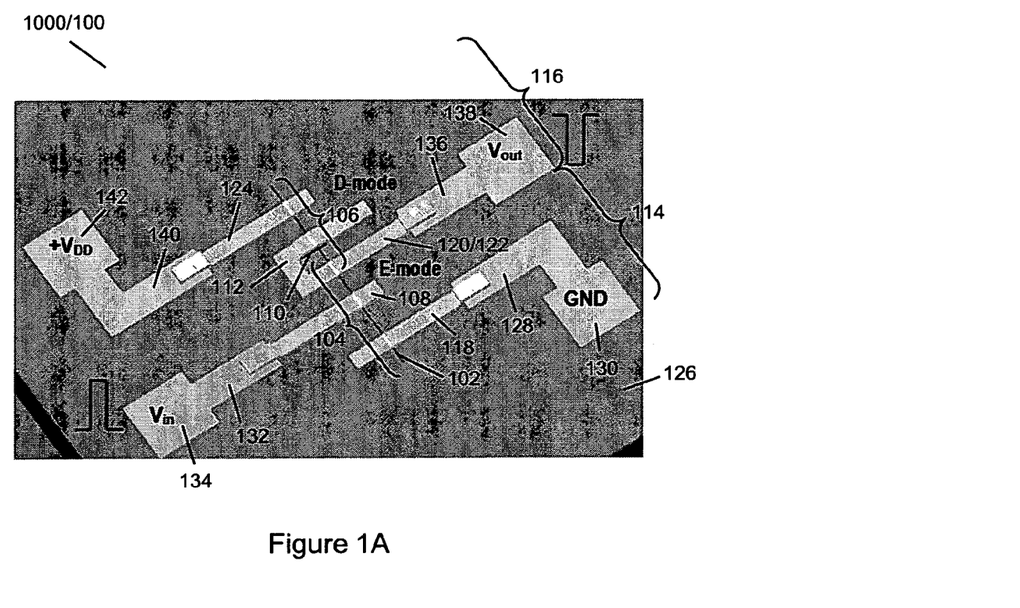
FIG. 1A shows a schematic diagram of a direct-coupled FET logic (DCFL) inverter fabricated on a single nanowire according to an embodiment.

FIG. 1A shows a schematic diagram 1000 of a direct-coupled FET logic (DCFL) inverter 100 fabricated on a single nanowire 102 according to an embodiment. The DCFL inverter 100 may include the nanowire 102 including a first nanowire region 104 and a second nanowire region 106, a first gate contact 108 disposed over the first nanowire region 104; an insulating region 110 disposed over the second nanowire region 106 and a second gate contact 112 disposed over the insulating region 110. The first nanowire region 104 and the first gate contact 108 may form a part of an enhancement mode transistor 114 and the second nanowire region 106, the insulating region 110 and the second gate contact 112 may form a part of a depletion mode transistor 116.

The enhancement and depletion modes of operations may be harnessed by engineering the first gate contact 108 and the second gate contact 112 in two different regions (i.e. first nanowire region 104 and second nanowire region 106) of the nanowire 102.

The first nanowire region 104 may be positioned adjacent to the second nanowire region 106. This may mean that the enhancement mode transistor 114 may be positioned adjacent to the depletion mode transistor 116. The insulating region 110 may be configured to substantially surround the second nanowire region 106 to enhance field-effect coupling between the second gate contact 112 (gate electrode) and the second nanowire region 106 (channel) of the depletion mode transistor 116.

The DCFL inverter or transistor arrangement 100 may further include a first source contact 118 and a first drain contact 120 respectively disposed in connection with and over the first nanowire region 104 such that the first gate contact 108 may be positioned between the first source contact 118 and the first drain contact 120. The transistor arrangement 100 may further include a second source contact 122 and a second drain contact 124 respectively disposed in connection with and over the second nanowire region 106 such that the second gate contact 112 may be positioned between the second source contact 122 and the second drain contact 124. The respective first source contact 118, the first gate contact 108 and the first drain contact 120 may be arranged substantially parallel to each other and the respective second source contact 122, the second gate contact 112 and the second drain contact 124 may also be arranged substantially parallel to each other. However, the arrangement of the respective first source contact 118, the first gate contact 108, the first drain contact 120, the second source contact 122, the second gate contact 112 and the second drain contact 124 may be any suitable arrangement and an absolute parallel arrangement may not a prerequisite.

The transistor arrangement 100 may further include a support substrate 126, wherein the nanowire 102 may be positioned above and spaced at a distance away from the support substrate 126.

The respective first source contact 118, the first drain contact 120, the second source contact 122, the second drain contact 124 may be formed by FIB-assisted deposition of a metal electrode (for example platinum (Pt)) directly onto the respective first nanowire region 104 and second nanowire region 106. This may result in the respective first source contact 118, the first drain contact 120, the second source contact 122, the second drain contact 124, forming respective ohmic contacts to the respective first nanowire region 104 and second nanowire region 106.

The first gate contact 108 may be formed by FEB-assisted deposition of a metal electrode (for example Pt) directly onto the first nanowire region 104 and some parts of the support substrate 126. This may result in the first gate contact 108 forming a schottky contact to the first nanowire region 104. The first gate contact 108 may be a Ω-shaped or any other suitable shapes. Since the Ω-shaped first gate contact 108 surrounding the first nanowire region 104 may be able to efficiently deplete the nanowire channel 102 (under the first gate contact 108) even in equilibrium, E-mode characteristics may be observed. On the other hand, an insertion of the insulating region 110 between the second gate contact 112 and the second nanowire region 106 may cause a partial depletion of electrons beneath the second gate contact 112, therefore a D-mode behavior may be observed.

In FIG. 1A, respective ground contact lead 128, and ground bonding pad 130 may be coupled in connection with or to the first source contact 118. Respective input contact lead 132 and input bonding pad 134 may also be coupled in connection with or to the first gate contact 108. Further, respective output contact lead 136 and output bonding pad 138 may be coupled in connection with or to the respective first drain contact 120, the second source contact 122 and the second gate contact 112 which may have been coupled together. Then, the respective supply contact lead 140, supply bonding pad 142 may be coupled in connection with or to the second drain contact 124.

The respective ground contact lead 128, ground bonding pad 130, input contact lead 132, input bonding pad 134, output contact lead 136, output bonding pad 138, supply contact lead 140 and supply bonding pad 142 may be formed by micro-fabrication of metals, for example gold (Au) platinum (Pt), palladium (Pd), iridium (Ir), nickel (Ni) for example. The respective ground contact lead 128, ground bonding pad 130, input contact lead 132, input bonding pad 134, output contact lead 136, output bonding pad 138, supply contact lead 140 and supply bonding pad 142 may be formed by the same or different metal or conductive materials.

In FIG. 1A, the first source contact 118 may be coupled to a ground potential (GND). The first gate contact 108 may be coupled to a voltage input ($V_{in}$) of the transistor arrangement or device 100. The first drain contact 120 may be coupled to the second source contact 122, therefore being seen as one common contact. The second gate contact 112 may be coupled to the first drain contact 120 and the second source contact 122, thereby implying that the first drain contact 120, the second source contact 122 and the second gate contact 112 may be the same. The second gate contact 112 may be coupled to a voltage output ($V_{out}$) of the transistor arrangement or transistor device 100. The second drain contact 124 may be coupled to a supply voltage ($V_{DD}$).

In an embodiment, the nanowire 102 may include a material selected from a group consisting of ZnO, $SnO_2$, $TiO_2$, GaN, InO, other semiconducting nanowires or nanotubes for example. Each of the first source contact 118, the first gate contact 108, the first drain contact 120, the second source contact 122, the second gate contact 112, the second drain contact 124 may include a metal material selected from a group consisting of Pt, Au, Pd, Ir, Ni, other high work-function metals or alloys for example. The insulating region 110 may include a material selected from a group consisting of $SiO_2$, $Al_2O_3$, $TiO_2$, $HfO_2$, other high-k dielectric materials for example.

In an embodiment, the nanowire 102 may be a n-channel nanowire. A part of the n-channel nanowire 102, which may be the D-mode FET 116 may act as a load of the transistor arrangement or transistor device 100 and the other part of the n-channel nanowire 102, which may be the E-mode FET 114, may operate as a driver of the transistor arrangement or transistor device 100. However, the nanowire 102 may also be a p-channel nanowire depending on user and design requirements. If the p-channel nanowire may be used, then the respective first gate contact 108 and the second gate contact 112 may include a low work-function metal gate, such as In, Sn or alloys for example.

Figure 1B:
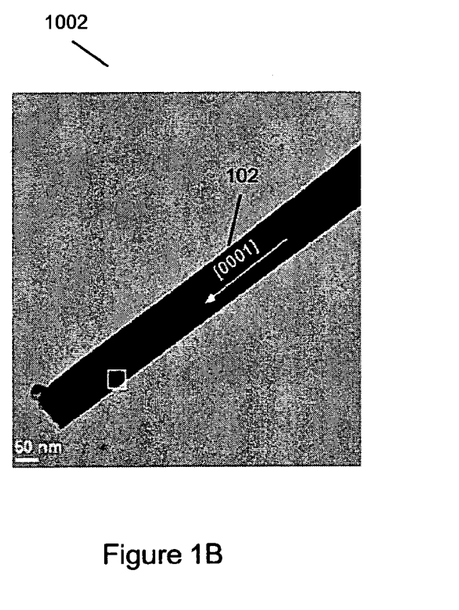
FIG. 1B shows a transmission electron microscopy (TEM) image of the nanowire as shown in FIG. 1A according to an embodiment.
Figure 1C:
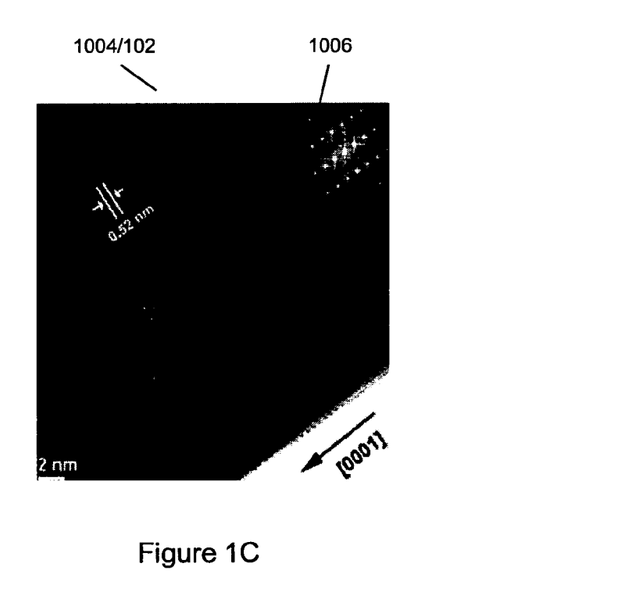
FIG. 1C shows a high-resolution transmission electron microscopy (HRTEM) image of the nanowire as shown in FIG. 1A and a corresponding selected area electron diffraction (SAED) pattern according to an embodiment.

FIG. 1B shows a transmission electron microscopy (TEM) image 1002 of the nanowire 102 as shown in FIG. 1A according to an embodiment. FIG. 1C shows a high-resolution transmission electron microscopy (HRTEM) image 1004 of the nanowire 102 as shown in FIG. 1A and a corresponding selected area electron diffraction (SAED) pattern 1006 shown in insert according to an embodiment.

Single-crystallinity of the nanowire channel 102 may be of paramount importance for high electron mobility and consequently superior device performance. Clear lattice fringes revealed in the HRTEM image 1004 as shown in FIG. 1C may confirm that the nanowires 102 may be highly crystalline and substantially free of defects such as twin structures, stacking faults, or dislocations. Under HRTEM observations as shown in FIG. 1C, it may also be found that this perfect crystal structure may be maintained well along the whole nanowire 102. In combination with the result of the SAED pattern 1006 as shown in the insert in FIG. 1C, the nanowires 102 may be determined to be grown along the [0001] direction. The spacing of about 0.52 nm between adjacent lattice planes may correspond well to the distance of (0001) planes of wurtzite ZnO, also indicating that [0001] may be the growth direction of the ZnO nanowire 102.

Figure 2A:
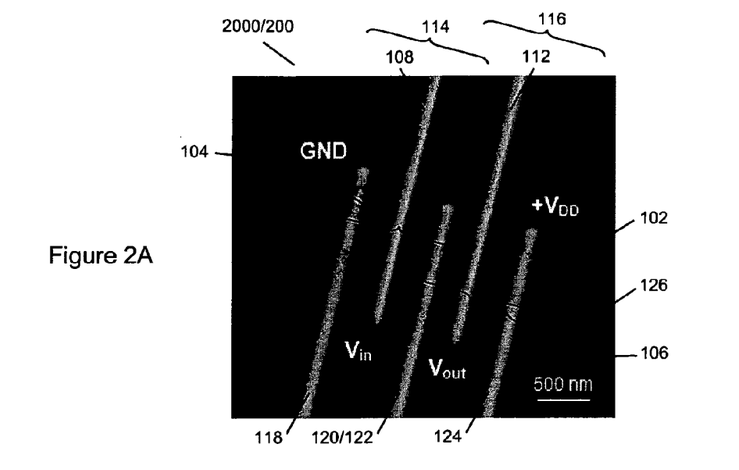
FIG. 2A shows a scanning electron microscopy (SEM) image of a DCFL inverter fabricated on a single nanowire according to an embodiment.

FIG. 2A shows a scanning electron microscopy (SEM) image 2000 of a direct-coupled FET logic (DCFL) inverter 200 fabricated on a single nanowire 102 according to an embodiment.

Having said that, the DCFL inverter 200 as shown in FIG. 2A may be similar to the DCFL inverter 100 as shown in FIG. 1A with some minor differences due to the fact that FIG. 1A shows the schematic diagram while FIG. 2A shows the SEM image. In more details, as FIG. 1A shows the schematic diagram and may not be drawn according to the scale, it may be possible to frame the core device (i.e. first source contact 118, first gate contact 108, first drain contact 120, second source contact 122, second gate contact 112 and second drain contact 124) and the interconnects (e.g. between respective second source contact 122/first drain contact 120 and second gate contact 112) together. On the other hand, for FIG. 2A, the core device may be highlighted by the SEM image or micrograph 2000 and it may not be possible to include the interconnects in the same frame (although the interconnects may exist at a distal place on the substrate or chip 126). Therefore, it may be seen in FIG. 1A that the second gate contact 112, the first drain contact 120 and the second source contact 122 may be arranged such that the second gate contact 112, the first drain contact 120 and the second source contact 122 may be coupled together at one end while this may not be shown in FIG. 2A.

The DCFL inverter 200 may also be termed as nano-inverter because of the nanometer-scaled channel or nanowire 102. The DCFL inverter or nano-inverter or logic inverter 200 may include an active switching device or 'driver', in series with a 'load' device. An E-mode transistor 114 may be preferred as the driver owing to the fact that the use of a depletion-mode driver may require an additional level-shifter to make the respective input and output voltage levels of the logic gate compatible. The incorporation of a level-shifter may introduce unwanted complexity in the circuit due to additional transistors and supply voltages. Conversely, a D-mode transistor 116 may be preferred as the load because depletion-load inverters exhibit (i) sharp voltage transfer characteristics (VTC) transition and better noise margin, (ii) single power supply and (iii) smaller overall layout area.

The DCFL inverter 200 may include the nanowire 102 including a first nanowire region 104 and a second nanowire region 106, a first gate contact 108 disposed over the first nanowire region 104; an insulating region (not shown) disposed over the second nanowire region 106 and a second gate contact 112 disposed over the insulating region. The first nanowire region 104 and the first gate contact 108 may form a part of the E-mode transistor 114 and the second nanowire region 106, the insulating region and the second gate contact 112 may form a part of the D-mode transistor 116.

The enhancement and depletion modes of operations may be harnessed by engineering the first gate contact 108 and the second gate contact 112 in two different regions (i.e. first nanowire region 104 and second nanowire region 106) of the nanowire 102.

The first nanowire region 104 may be positioned adjacent to the second nanowire region 106. This may mean that the enhancement mode transistor 114 may be positioned adjacent to the depletion mode transistor 116.

The DCFL inverter or transistor arrangement 200 may further include a first source contact 118 and a first drain contact 120 respectively disposed in connection with and over the first nanowire region 104 such that the first gate contact 108 may be positioned between the first source contact 118 and the first drain contact 120. The transistor arrangement 200 may further include a second source contact 122 and a second drain contact 124 respectively disposed in connection with and over the second nanowire region 106 such that the second gate contact 112 may be positioned between the second source contact 122 and the second drain contact 124. The respective first source contact 118, the first gate contact 108, the first drain contact 120, the second source contact 122, the second gate contact 112 and the second drain contact 124 may be arranged substantially parallel to each other.

The transistor arrangement may further include a support substrate 126, wherein the nanowire 102 may be positioned above and spaced at a distance away from the support substrate 126.

The respective first source contact 118, the first drain contact 120, the second source contact 122, the second drain contact 124 may be formed by FIB-assisted deposition of a metal electrode (for example platinum (Pt)) directly onto the respective first nanowire region 104 and second nanowire region 106. This may result in the respective first source contact 118, the first drain contact 120, the second source contact 122, the second drain contact 124, forming respective ohmic contacts to the respective first nanowire region 104 and second nanowire region 106.

The first gate contact 108 may be formed by FEB-assisted deposition of a metal electrode (for example Pt) directly onto the first nanowire region 104. This may result in the first gate contact 108 forming a schottky contact to the first nanowire region 104. The first gate contact 108 may be a Ω-shaped or any other suitable shapes. Since the Ω-shaped first gate contact 108 surrounding the first nanowire region 104 may be able to efficiently deplete the nanowire channel 102 (under the first gate contact 108) even in equilibrium, E-mode characteristics may be observed. On the other hand, an insertion of the insulating region between the second gate contact 112 and the second nanowire region 106 may cause a partial depletion of electrons beneath the second gate contact 112, therefore a D-mode behavior may be observed.

In FIG. 2A, the first source contact 118 may be coupled to a ground potential (GND). The first gate contact 108 may be coupled to a voltage input ($V_{in}$) of the transistor device 200. The first drain contact 120 may be coupled to the second source contact 122 and thereby shown as one common contact. The second gate contact 112 may be coupled to a voltage output ($V_{out}$) of the transistor arrangement or device 200. The second drain contact 124 may be coupled to a supply voltage ($V_{DD}$).

In an embodiment, the nanowire 102 may include a material selected from a group consisting of ZnO, $SnO_2$, $TiO_2$, GaN, InO, other semiconducting nanowires or nanotubes. Each of the first source contact 118, the first gate contact 108, the first drain contact 120, the second source contact 122, the second gate contact 112, the second drain contact 124 may include a metal material selected from a group consisting of Pt, Au, Pd, Ir, Ni, other high work-function metals. The insulating region may include a material selected from a group consisting of $SiO_2$, $Al_2O_3$, $TiO_2$, $HfO_2$, other high-k dielectric materials for example.

In an embodiment, the nanowire 102 may be a n-channel nanowire. A part of the n-channel nanowire 102, which may be the D-mode FET 116 may act as a load of the transistor arrangement or transistor device 200 and the other part of the n-channel nanowire 102, which may be the E-mode FET 114, may operate as a driver of the transistor arrangement or transistor device 200. However, the nanowire 102 may also be a p-channel nanowire depending on user and design requirements.

Figure 2B:
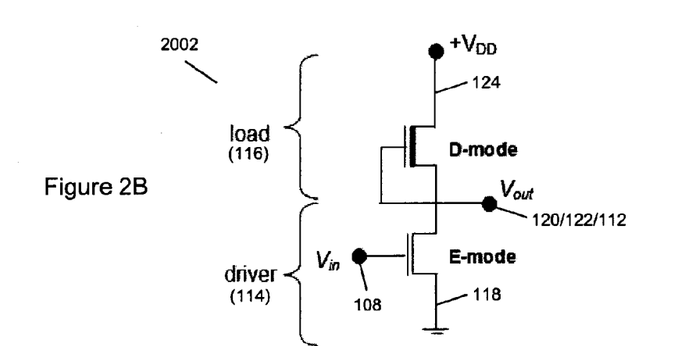
FIG. 2B shows a circuit diagram of the DCFL inverter as shown in FIG. 2A according to an embodiment.

FIG. 2B shows a circuit diagram 2002 of the DCFL inverter 200 as shown in FIG. 2A according to an embodiment.

Like in FIG. 2A, the DCFL inverter or transistor arrangement 200 may include an E-mode transistor 114 and a D-mode transistor 116.

The E-mode transistor 114 may form a driver of the transistor arrangement 200 and the D-mode transistor 116 may form a load of the transistor arrangement 200.

The E-mode transistor 114 may include a first source contact 118, a first gate contact 108 and a first drain contact 120 and the D-mode transistor 116 may include a second source contact 122, a second gate contact 112 and a second drain contact 124.

In FIG. 2B, the first source contact 118 may be coupled to a ground potential (GND). The first gate contact 108 may be coupled to a voltage input ($V_{in}$) of the transistor arrangement 200. The second gate contact 112 may be the same as the second source contact 122 and the first drain contact 120 such that $V_{gs,\ load}=0$. The second gate contact 112 may be coupled to a voltage output ($V_{out}$) of the transistor arrangement 200. The second drain contact 124 may be coupled to a supply voltage ($V_{DD}$). Since the threshold voltage of the D-mode transistor 116 may be negative ($V_T<0$), the condition $V_{gs}>V_T$ may be satisfied, which may always keep a conducting channel of the load, irrespective of the input or output voltage.

Figure 2C:
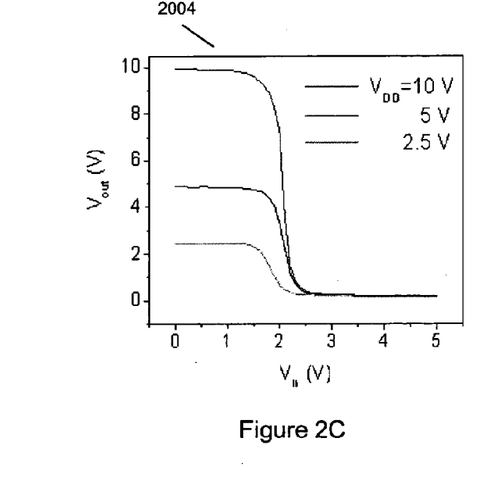
FIG. 2C shows voltage transfer characteristic (VTC) curves of the DCFL inverter as shown in FIG. 2A obtained with an input voltage range of 0V to 5V under various values of $V_{DD}$ from 2.5V to 10V according to an embodiment.

FIG. 2C shows voltage transfer characteristic (VTC) curves 2004 of the DCFL inverter 200 as shown in FIG. 2A obtained with an input voltage range of 0V to 5V under various values of $V_{DD}$ from 2.5V to 10V according to an embodiment.

The operating mode of the DCFL inverter or NOT logic circuit 200 may be determined by the output voltage level ($V_{out}$). For the very low input bias state ($V_{in}$=logical 0) of the E-mode transistor 114 (or driver), the nanowire channel 102 underneath the first gate contact or gate region 108 may remain depleted. The driver 114 may be in the 'cut-off' state and may conduct only a minimal leakage current. Consequently, there may be an insignificant voltage drop across the load 116 and the output may be at the high state ($V_{out}$=logical 1), close to the supply voltage $V_{DD}$=+5V. As the input voltage may be increased, the driver 114 may eventually be driven to its 'accumulation' state and may start conducting a finite amount of current. The output voltage ($V_{out}$) of the DCFL inverter 200 may begin falling eventually from a high state and the VTC may enter into a transition region. With further increase in $V_{in}$, a state may be reached when the driver 114 may be fully conducting and most of the supply voltage may be dropped across the less conducting D-mode transistor 116 (load) for which $V_{gs,\ load}$ may be set to about 0V. This may in turn drive the output of the inverter 200 to a logical '0' state with $V_{out}$ slightly above zero. In fact, a nominal voltage of about 0.15V, which may originate from the low channel resistance of the E-mode transistor or driver 114, may be measured at the output of the inverter 200. The transition region between logical '1' and logical '0' states may be defined by two critical voltage points (points of inflection) on the VTC, where the slope of the curve ($dV_{out}/dV_{in}$) may equal to about −1. The lower and higher input voltage values $V_{IL}$ and $V_{IH}$, respectively, satisfying the above conditions play a significant role in determining the noise margins of the inverter 200. From the VTC 2004 in FIG. 2C, one may determine the values of $V_{IL}$ and $V_{IH}$ to be about 1.65 V and about 2.48 V, respectively for $V_{DD}$=5.0 V. The noise margins of the inverter 200 may be calculated accordingly from the lower ($V_{OL}$=0.19 V) and higher output ($V_{OH}$=5.0 V) values. The noise margin for high signal level, $NM_H$ (=$V_{OH}$-$V_{IH}$) may turn out to be about 2.52 V, while that for low signal level, $NM_L$ (=$V_{IL}$-$V_{OL}$) may be about 1.46 V. The values of noise margins may indicate the noise immunity of the transistor arrangement or circuit 200, that is to say, the noise tolerance may increase with the noise margins.

Figure 2D:
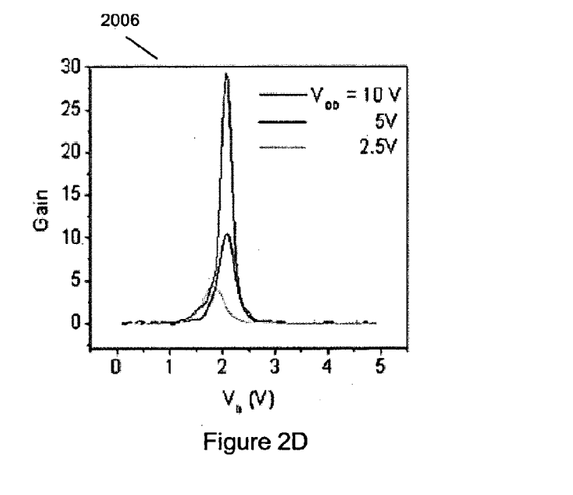
FIG. 2D shows voltage gain characteristics derived from the corresponding VTC curves as shown in FIG. 2C according to an embodiment.

FIG. 2D shows voltage gain characteristics 2006 derived from the corresponding VTC curves 2004 as shown in FIG. 2C according to an embodiment.

The voltage gain of the inverter 200, which may be defined as the maximum slope of the VTC between high and low states, may be calculated for various $V_{DD}$ values. As noticed from FIG. 2D, the voltage gain of the inverter 200 may increase with the magnitude of $V_{DD}$ and may reach a value of about 29 for $V_{DD}$=10.0 V. A high voltage gain may imply a sharp transition between logical high and low states and may guarantee efficient signal transfer to the following stages i.e. driver stage 114 or load stage 116.

Figure 3A:
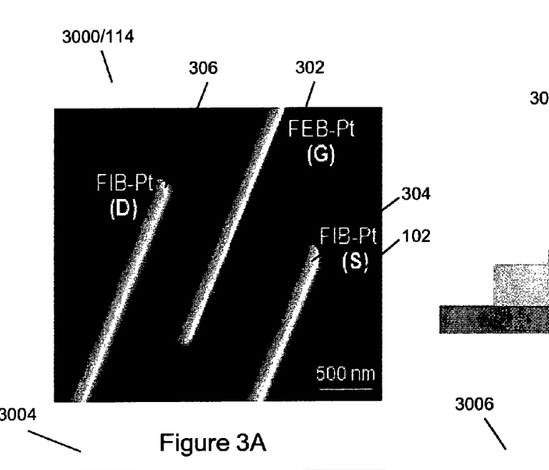
FIG. 3A shows a scanning electron microscopy (SEM) image of an E-mode field-effect transistor (FET) on a nanowire according to an embodiment.

FIG. 3A shows a scanning electron microscopy (SEM) image 3000 of an E-mode field-effect transistor (FET) 114 on a nanowire 102 according to an embodiment.

The E-mode FET 114 may include the nanowire 102, a gate contact or gate electrode 302 directly written onto a region (hidden) of the nanowire 102 and respective source 304 and drain contacts 306 (or source and drain electrodes) directly written onto respective further regions (hidden) of the nanowire 102.

The gate contact 302 may be formed by FEB-assisted deposition of a metal electrode (for example Pt) directly onto the region of the nanowire 102. This may result in the gate contact 302 forming a schottky contact to the region of the nanowire 102.

The respective source contact 304 and the drain contact 306 may be formed by FIB-assisted deposition of a metal electrode (for example platinum (Pt)) directly onto the respective further regions of the nanowire 102. This may result in the respective source contact 304 and the drain contact 306, forming respective ohmic contacts to the respective further regions of the nanowire 102.

From FIG. 3A, the gate contact 302 may be shown to be positioned between the source contact 304 and the drain contact 306. Further, the respective gate contact 302, the source contact 304 and the drain contact 306 may be arranged substantially parallel to each other. However, any other suitable arrangement or configuration may also be possible depending on user and design requirements.

Figure 3B:
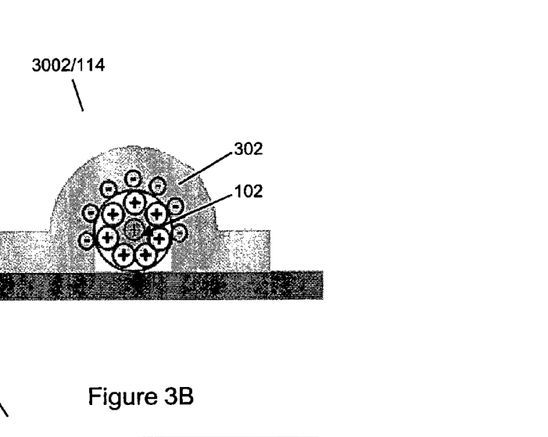
FIG. 3B shows a schematic representation of a cross-section of the E-mode FET as shown in FIG. 3A according to an embodiment.

FIG. 3B shows a schematic representation 3002 of a cross-section of the E-mode FET 114 as shown in FIG. 3A according to an embodiment.

From FIG. 3B, it may be seen that the gate contact 302 (Pt electrode) may be Ω-shaped. Since the Ω-shaped gate contact 302 surrounding the region of the n-channel ZnO nanowire 102 may be able to efficiently deplete the nanowire channel 102 (under the gate contact) even in equilibrium, E-mode characteristics may be observed.

Modeling in terms of a typical schottky contact that may exist at an interface of the Pt electrode 302 and a ZnO thin film 102, the depletion layer width ($W_d$) may be estimated to be around 50 nm using the formula $W_d=[2\epsilon_0\epsilon_s(\phi_m-\chi_s)/(qn)]^{1/2}$, where $\epsilon_s$, $\chi_s$ and n are dielectric constant (about 7.9), electron affinity (about 4.1 eV) and majority carrier concentration (about $5.5\times10^{18}$ cm$^{-3}$) in the ZnO nanowire 102, respectively. Thus, it may be expected that a nanowire 102 with 80-90 nm diameter may be fully depleted by a Ω-shaped surrounding top gate contact 302 that may make a schottky contact to the nanowire channel 102.

Figures 3C, 3D:
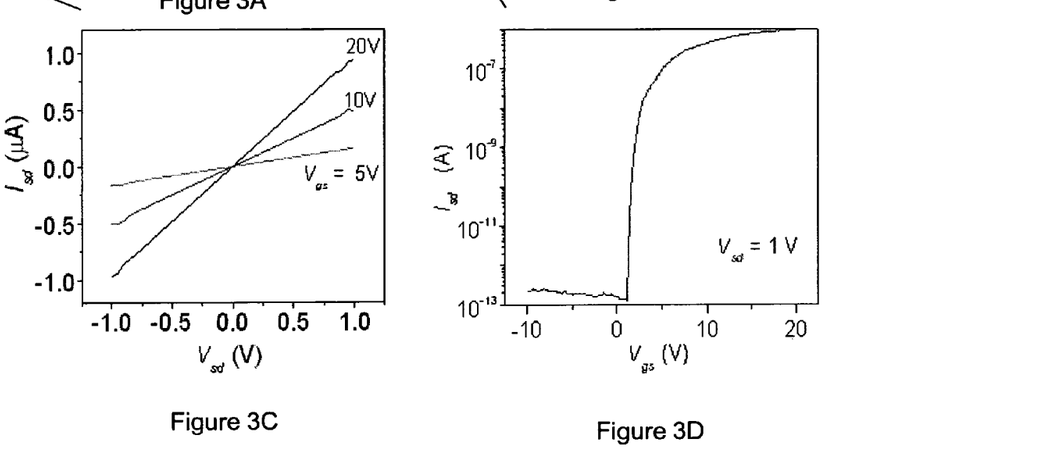
FIG. 3C shows current-voltage characteristics of the E-mode FET as shown in FIG. 3A according to an embodiment.
FIG. 3D shows transfer characteristics of the E-mode FET as shown in FIG. 3A according to an embodiment.

FIG. 3C shows current-voltage characteristics 3004 of the E-mode FET 114 as shown in FIG. 3A according to an embodiment.

FIG. 3C shows typical $I_{sd}$-$V_{sd}$ characteristic curves at various constant gate voltages ($V_{gs}$). Linear and symmetric nature of the curves may suggest relatively good ohmic contacts at both ends of the nanowire 102. The electrical properties of the FIB-deposited Pt contacts 304, 306 on ZnO nanowires 102 may divulge a specific contact resistance value as low as about $1.1\times10^{-5}$ Ω-cm$^2$. The formation of respective schottky contact and ohmic contacts on the same nanowire 102 by FEB- and FIB-assisted deposition of platinum strips, respectively, may be interpreted in the following way. According to the Schottky-Mott model, a barrier height of 1.6 eV may be predicted when Pt ($\phi_m$=5.7 eV) may be deposited on ZnO ($\chi_s$=4.1 eV). Hence, a schottky barrier may be expected to exist at the Pt/ZnO interface when the interface may have minimal defect states, which may be the case for FEB-induced deposition of Pt gate 302. However, during FIB-assisted deposition of Pt source contact 304 and drain contact 306, a large number of defects may be created on the surface of the ZnO nanowire 102 by the high energy ions. The bombardment effect, in association with Ga$^+$ ion implantation, may presumably generate substantially high interfacial states that may cause pinning of the Fermi level. In addition, higher carbon content (residue of the organometallic precursor) in the Pt film deposited by FEB, compared to that in the film deposited by FIB, may play a role in determining the barrier height at the Pt/ZnO interface. Additionally, at a given source-to-drain bias, the increment (decrement) of channel current with higher (lower) positive gate bias may indicate that the majority charge carriers may be electrons. In the absence of any intentional doping, the intrinsic n-type conductivity of the ZnO nanowire 102 may usually arise from the oxygen vacancies (that may exist as $O_2^-$, $O^-$ or $O^{2-}$) and/or Zn interstitials.

FIG. 3D shows transfer characteristics 3006 of the E-mode FET 114 as shown in FIG. 3A according to an embodiment.

The transfer characteristic 3006 as shown in FIG. 3D may demonstrate the efficiency of gate control on the channel conductance at a given $V_{sd}$ (about 1.0 V). The values of threshold voltage, trans-conductance ($g_m$), on-off ratio and the off-state leakage current may be calculated to be about 1.1 V, about 55 nS, about $10^6$ and about $1.2\times10^{-13}$ A, respectively. The high on-off ratio along with a low source-drain leakage current may suggest efficient gate control on the ZnO nanowire channel 102. The leakage current between the nanowire channel 102 and the Pt gate 302 for the E-mode transistor 114 may be about $10^{-13}$ A at a $V_{gs}$=about −10 V, which may suggest that the gate leakage current may only slightly affect the FET characteristics.

Figure 4A:
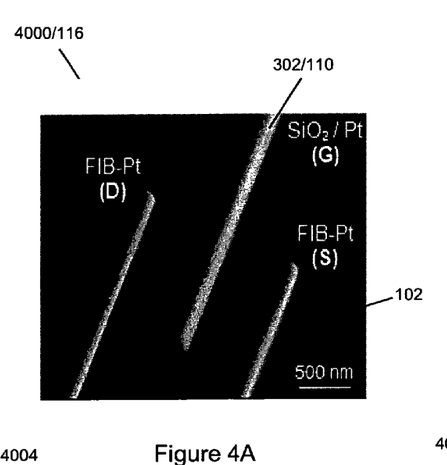
FIG. 4A shows a scanning electron microscopy (SEM) image of a D-mode field-effect transistor (FET) on a nanowire according to an embodiment.

FIG. 4A shows a scanning electron microscopy (SEM) image 4000 of a D-mode field-effect transistor (FET) 116 on a nanowire 102 according to an embodiment.

The D-mode FET device 116 as shown in FIG. 4A may differ from the E-mode FET 114 as shown in FIG. 3A such that an insulating layer may be deposited beneath the top metal gate contactor electrode 302.

The insulating layer may be formed by direct writing of a dielectric layer onto a region of the nanowire 102, thereby forming the insulating region 110 (hidden in FIG. 4A but as shown later in FIG. 4B). Then, the gate contact 302 may be formed by directly writing a metal electrode onto the insulating region 110.

The insulating layer may include about 25 nm of silicon oxide deposited in situ prior to FIB-deposition of the Pt gate contact or gate electrode 302.

Figure 4B:
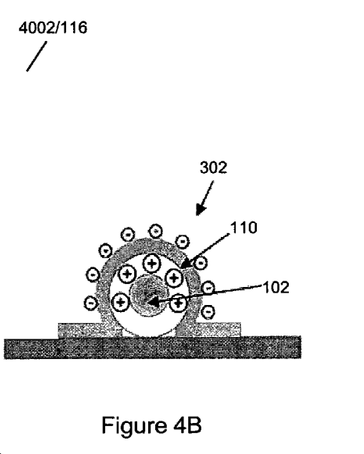
FIG. 4B shows a schematic representation of a cross-section of the D-mode FET as shown in FIG. 4A according to an embodiment.

FIG. 4B shows a schematic representation 4002 of a cross-section of the D-mode FET 116 as shown in FIG. 4A according to an embodiment.

FIG. 4B shows that the insertion of the insulating region 110 between the gate contact 302 and the region of the nanowire 102 may cause a partial depletion of electrons beneath the gate contact 302 under equilibrium (zero bias) condition, therefore a D-mode behavior may be observed.

Figure 4C:
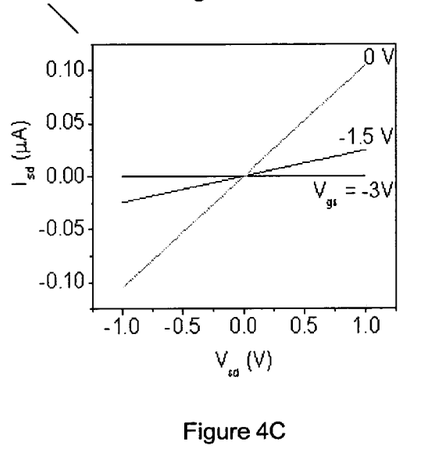
FIG. 4C shows current-voltage characteristics of the D-mode FET as shown in FIG. 4A according to an embodiment.

FIG. 4C shows current-voltage characteristics 4004 of the D-mode FET 116 as shown in FIG. 4A according to an embodiment.

It may be observed that with the application of a gradual negative gate bias, the channel current may decrease, which may indicate a D-mode operation.

Figure 4D:
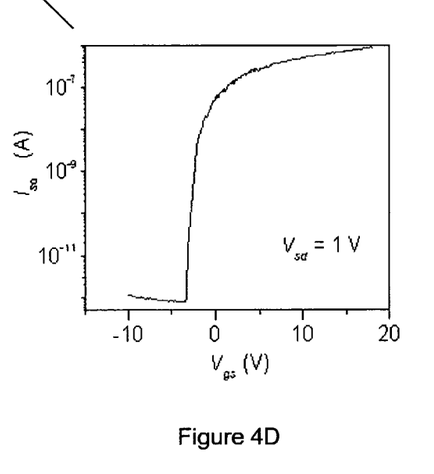
FIG. 4D shows transfer characteristics of the D-mode FET as shown in FIG. 4A according to an embodiment.

FIG. 4D shows transfer characteristics 4006 of the D-mode FET 116 as shown in FIG. 4A according to an embodiment.

From transfer characteristics 4006 as shown in FIG. 4D, it may be seen that the channel conductivity may ceased at a gate voltage around −3.4 V, which may be the threshold voltage for the D-mode FET 116.

Figure 5:
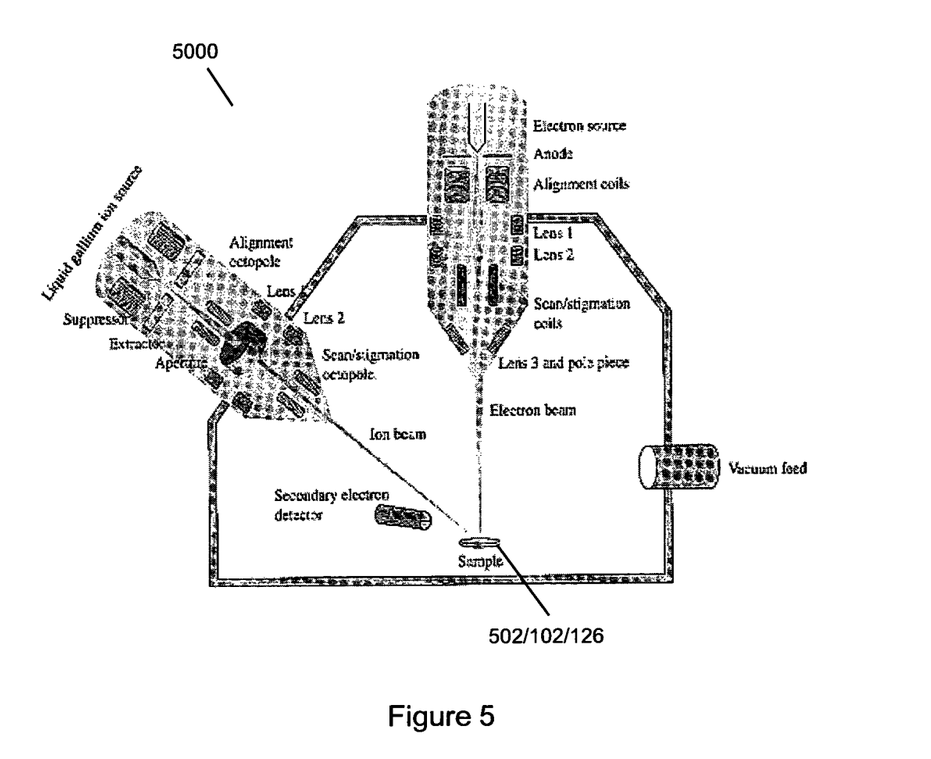
FIG. 5 shows a dual-beam system for direct writing of a metal electrode or a dielectric layer onto a nanowire according to an embodiment.

FIG. 5 shows a dual-beam system 5000 for direct writing of a metal electrode or a dielectric layer onto a nanowire 102 according to an embodiment.

The sample 502 may be about 1 µl droplet of well-dispersed suspension of ZnO nanowires 102 in ethanol spotted at a centre of the oxide-coated silicon substrate 126, which may be pre-patterned with microfabricated Au/Cr electrodes and bonding pads. Due to its well dispersive nature in a diluted suspension, a nearly uniformed distribution of individual ZnO nanowires 102 may be observed in an active region of the substrate 126. Just before device construction, each sample 502 may be given a brief oxygen plasma treatment to remove any contaminant on the ZnO nanowires 102.

Direct-writing of metal electrodes and insulating layer may be performed in a Helios 600 dual-beam FIB system 500 for example as shown in FIG. 5. After placing the sample 502 at an eccentric height, which may be at the focal plane for electron beam as well as that for ion beam, the sample 502 or the individual ZnO nanowires 102 may be located by a secondary electron detector. Electron- or ion-beam assisted selective deposition of Pt metal on the nanowire 102 may be accomplished using an organometallic precursor trimethyl-cyclopentadienylplatinum, $(CH_3)_3Pt(CpCH_3)$, which may be emanated from a gas injection system. For the ohmic contacts at the source 118 and drain 120 electrode regions, FIB-assisted deposition of Pt may be carried out. The $Ga^+$ ions may be accelerated at about 30 kV at a beam current of about 9.7 pA over an about 200 nm wide defined area with a steady flow of the precursor gas. On the other hand, for defining the gate contact 108 or gate area on the E-mode transistor 114, an electron beam may be scanned with an acceleration voltage of about 5 kV and a beam current of about 86 pA in presence of the same precursor gas. The acceleration voltage of the electron or ion beam may be kept at an optimal value to minimize the delocalized (halo) deposits due to incident stray ions for FIB and due to back and forward scattered electrons for FEB. To deposit an insulating layer on the defined gate region of the D-mode transistor 116, an alkoxysilane precursor tetraethoxysilane (TEOS) may be used while scanning the ion beam at an acceleration voltage of about 30 kV at a beam current of about 10 nA. The electrical measurements may be performed at a room temperature using a probe station and an Agilent 4156C high precision semiconductor parameter analyzer for example.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A transistor arrangement, comprising:
   a nanowire comprising a first nanowire region and a second nanowire region;
   a first gate contact disposed over the first nanowire region;
   an insulating region disposed over the second nanowire region;
   a second gate contact disposed over the insulating region;
   wherein the first nanowire region and the first gate contact forms a part of an enhancement mode transistor and the second nanowire region, the insulating region and the second gate contact forms a part of a depletion mode transistor.

2. The transistor arrangement of claim 1, further comprising
   a first source contact and a first drain contact respectively disposed in connection with or over the first nanowire region such that the first gate contact is positioned between the first source contact and the first drain contact.

3. The transistor arrangement of claim 1, further comprising
   a second source contact and a second drain contact respectively disposed in connection with or over the second nanowire region such that the second gate contact is positioned between the second source contact and the second drain contact.

4. The transistor arrangement of claim 1,
   wherein the first gate contact and the first nanowire region form a schottky contact.

5. The transistor arrangement of claim 2,
   wherein the first source contact and the first nanowire region form an ohmic contact and the first drain contact and the first nanowire region form a further ohmic contact.

6. The transistor arrangement of claim 1,
   wherein the insulating region is configured to substantially surround the second nanowire region.

7. The transistor arrangement of claim 1,
   wherein the second nanowire region is positioned adjacent to the first nanowire region.

8. The transistor arrangement of claim 1, further comprising
   a support substrate,
   wherein the nanowire is positioned above and spaced at a distance away from the support substrate.

9. The transistor arrangement of claim 2,
   wherein the first source contact is coupled to a ground potential.

10. The transistor arrangement of claim 1,
    wherein the first gate contact is coupled to a voltage input of the transistor arrangement.

11. The transistor arrangement of claim 3,
    wherein the first drain contact is coupled to the second source contact.

12. The transistor arrangement of claim 1,
wherein the second gate contact is coupled to a voltage output of the transistor arrangement.

13. The transistor arrangement of claim 3,
wherein the second drain contact is coupled to a supply voltage.

14. The transistor arrangement of claim 3,
wherein the second gate contact is further coupled to the first drain contact and the second source contact.

* * * * *